(12) United States Patent
Ishii et al.

(10) Patent No.: US 7,629,091 B2
(45) Date of Patent: Dec. 8, 2009

(54) POLYIMIDE COMPOUND AND FLEXIBLE WIRING BOARD

(75) Inventors: Junichi Ishii, Tochigi (JP); Tadashi Akamatsu, Tochigi (JP)

(73) Assignees: Sony Corporation, Tokyo (JP); Sony Chemical and Device Information, Tokyo (JP)

( * ) Notice: Subject to any disclaimer, the term of this patent is extended or adjusted under 35 U.S.C. 154(b) by 0 days.

(21) Appl. No.: 11/814,659

(22) PCT Filed: Oct. 28, 2005

(86) PCT No.: PCT/JP2005/019863

§ 371 (c)(1),
(2), (4) Date: Jul. 24, 2007

(87) PCT Pub. No.: WO2006/080119

PCT Pub. Date: Aug. 3, 2006

(65) Prior Publication Data

US 2008/0090927 A1   Apr. 17, 2008

(30) Foreign Application Priority Data

Jan. 28, 2005   (JP)   ............................. 2005-021253

(51) Int. Cl.
    *G03F 7/004* (2006.01)
(52) U.S. Cl. .................... 430/18; 430/191; 430/192; 430/193; 430/270.1; 528/353
(58) Field of Classification Search .................. 430/18, 430/191, 192, 193, 270.1; 528/353
    See application file for complete search history.

(56) References Cited

U.S. PATENT DOCUMENTS

| | | | | |
|---|---|---|---|---|
| 5,288,588 | A * | 2/1994 | Yukawa et al. | 430/192 |
| 6,677,099 | B1 * | 1/2004 | Ishii et al. | 430/165 |
| 6,887,643 | B2 * | 5/2005 | Fujita et al. | 430/191 |
| 6,933,087 | B2 * | 8/2005 | Suwa et al. | 430/7 |
| 7,026,080 | B2 * | 4/2006 | Nakayama et al. | 430/18 |
| 2004/0127595 | A1 * | 7/2004 | Nomura et al. | 522/164 |

FOREIGN PATENT DOCUMENTS

| | | |
|---|---|---|
| JP | 2000-022288 | 1/2000 |
| JP | 2000-075478 | 3/2000 |
| JP | 2000-177201 | 6/2000 |
| JP | 2000-188445 | 7/2000 |
| JP | 2001-125266 | 5/2001 |
| JP | 2005-146025 | 6/2005 |
| JP | 2005-325332 | 11/2005 |

OTHER PUBLICATIONS

International Search Report dated Jan. 10, 2006 (2 pages).

* cited by examiner

*Primary Examiner*—John S Chu
(74) *Attorney, Agent, or Firm*—K&L Gates LLP

(57) ABSTRACT

A polyimide compound has a low coefficient of linear thermal expansion comparable to the coefficient of linear thermal expansion of a conductor to be covered by the polyimide. The polyimide compound is less susceptible to contraction caused by dehydration process. The compound is obtained by the reaction of a highly linear acid dianhydride with a highly linear diamine and has a high imidization rate. Having a low coefficient of linear thermal expansion comparable to the conductor to be covered by the polyimide, the polyimide compound of the present invention is less susceptible to contraction that occurs during polyimide formation. The polyimide compound is suitable for making curl-free flexible wiring boards.

5 Claims, 8 Drawing Sheets

POLYIMIDE COMPOUND AND FLEXIBLE WIRING BOARD

TECHNICAL FIELD

The present invention relates to polyimide compounds and flexible wiring boards obtained by depositing a polyimide compound over conductors.

BACKGROUND ART

A flexible wiring board includes an insulative polyimide resin layer that is directly deposited over conductors, such as copper foil, without the help of any adhesive layer. Such a flexible wiring board is generally manufactured by the following process. First, acid dianhydride and diamine are polymerized in a solvent such as N-methyl-2-pyrrolidone to obtain a polyimide precursor containing a polyamic acid. The polyimide precursor is then applied over a conductor and is dried to form a layer containing a polyamic acid. This layer is heated to imidize the polyamic acid and thus form a polyimide resin layer over the conductor.

One problem with this approach is that the conductor such as a copper foil has a relatively low coefficient of linear thermal expansion while polyimide generally has a relatively high coefficient of linear thermal expansion, so that the difference in coefficient of linear thermal expansion between the conductor and the polyimide causes the flexible wiring board to curl. The flexible wiring boards also tend to curl as the polyimide layer undergoes dehydration and contracts during formation of polyimide and internal stress builds up between the resulting polyimide and the conductor.

The curling of flexible wiring boards can be reduced by using a polyimide with a relatively low coefficient of linear thermal expansion to minimize the difference in coefficient of linear thermal expansion between the conductor and the polyimide. To decrease the coefficient of linear thermal expansion of polyimides, highly linear monomers such as pyromellitic dianhydride, 3,4,3',4'-biphenyltetracarboxylic dianhydride and p-phenylenediamine are used in combination to form a polymer. The internal stress that builds up during the formation of polyimide can be removed by heating the imidized polyimide film above the glass transition temperature to plasticize the polymer.

When a polyimide precursor applied over conductors is thermally imidized, the imidization process must be carried out at significantly high temperatures to ensure that the precursor is completely imidized (100% imidization). Moreover, the polyimide film must be heated to a temperature of at least 300° C. or above, typically 350° C. or above, to remove internal stress. Such high temperature heat treatment may result in oxidation of conductors or affect the dimension stability of conductor patterns.

In one approach to prevent the curling of flexible wiring boards, a first polyimide precursor having a relatively low coefficient of linear thermal expansion is sandwiched between layers of a second polyimide precursor having a relatively high coefficient of linear thermal expansion to make the total coefficient of linear thermal expansion equal to the coefficient of linear thermal expansion of copper (See, for example, Patent Document 1). In another approach, a plasticizing additive is added to a polyimide having a high glass transition temperature and a low coefficient of linear thermal expansion so that the polyimide is plasticized at a desired temperature (See, for example, Patent Document 2). Furthermore, a flexible printed board has been proposed in which a polyimide resin layer is arranged in contact with a conductor. This polyimide resin layer is formed by imidization of a polyimide precursor containing a polyamic acid component and a polyimide component. The polyamic acid component is obtained by the reaction of an acid anhydride component with an amine component, and the polyimide component is obtained by the reaction of the acid anhydride component with an isocyanate component (See, for example, Patent Document 3). In still another approach, a polyimide precursor is used that has a lower coefficient of linear thermal expansion than copper foil. In this manner, the contraction of the polyimide film can be accommodated. Another technique involves dissolving a soluble polyimide in a solvent, drying the soluble polyimide and then depositing the dried polyimide on a copper foil to form a film.

[Patent Document 1]
Japanese Patent Application Laid-Open No. 2000-188445
[Patent Document 2]
Japanese Patent Application Laid-Open No. 2001-177201
[Patent Document 3]
Japanese Patent Application Laid-Open No. 2000-022288

DISCLOSURE OF THE INVENTION

Problems to be Solved by the Invention

In the flexible wiring board described in Patent Document 1, in general, a polyimide having a relatively low coefficient of linear thermal expansion shows a relatively high glass transition temperature, while another polyimide having a relatively high coefficient of linear thermal expansion shows a relatively low glass transition temperature. Specifically, the polyimide with high glass transition temperature is made from a first polyimide precursor with a low coefficient of linear thermal expansion, and the polyimide with low glass transition temperature is made from a second polyimide precursor with a high coefficient of linear thermal expansion. In this flexible wiring board, the first polyimide precursor is sandwiched between two layers of the second polyimide precursor to make a three-layered polyimide laminate. The internal stress can be reduced by heating the polyimide laminate above the glass transition temperature of the polyimide made from the second polyimide precursor. This however requires a heat treatment at 300° C. or higher. In addition, the application process of the polyimide precursors adds to the number of steps involved, making it difficult to control the film thickness.

The additive used in the flexible board described in Patent Document 2 tends to spatter in the oven during the heat treatment and contaminates the oven. Moreover, the resulting polyimide must be heated to 300° C. or above to remove the internal stress, which may result in oxidation of conductors and affect the dimension stability of conductive patterns.

The flexible printed board described in Patent Document 3 requires an isocyanate component to form the polyimide component of the polyimide precursor. Although this isocyanate component is intended to react with an acid anhydride, it is more likely to react with hydroxyl groups than with acid anhydride if the monomer component bears hydroxyl groups. This leads to failure to obtain the desired polyimide. In other words, the use of isocyanate will limit the types of monomer that can be used. In particular, monomers cannot be used if they bear phenolic hydroxyl groups that serve to increase the solubility in an alkali.

The approach that employs a polyimide precursor having a lower coefficient of linear thermal expansion than copper foil so as to accommodate the contraction of the polyimide film may lead to an increased rigidity of the polyimide and, thus, a decreased adhesion of the polyimide to the copper foil. As a result, the copper foil may be separated from the polyimide. The low coefficient of linear thermal expansion of the polyimide precursor as compared to the copper foil also causes the flexible wiring board to curl toward the copper foil when the copper foil is etched.

The approach comprising dissolving a soluble polyimide in a solvent, drying the soluble polyimide, and then depositing the dried polyimide on a copper foil can overcome the problem of internal stress caused by imidization of polyimide precursor since polyimide is not formed on the copper film. However, the difference in the coefficient of linear thermal expansion between the polyimide and copper film causes the curling of the flexible wiring board. While this can be avoided by lowering the coefficient of linear thermal expansion through addition of a large amount of a filler to the polyimide, the presence of the filler deteriorates a resistance to bending of the flexible wiring board.

The present invention addresses the above-described conventional problems. Thus, it is an object of the invention to provide a polyimide compound that has a low coefficient of linear thermal expansion comparable to conductors and that is less susceptible to internal stress that arises as the polyimide precursor undergoes dehydration. It is another object of the present invention to provide a flexible wiring board that uses the polyimide compound and is thus less susceptible to curing.

Means for Solving the Problems

Accordingly, a polyimide compound of the present invention is obtained by the reaction of an acid dianhydride with a diamine and is represented by the following formula (1).

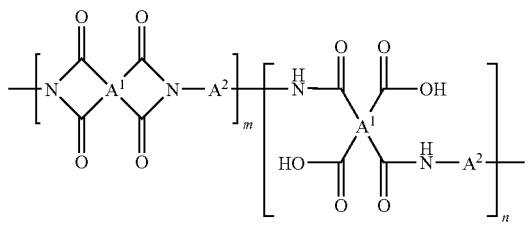
(1)

In the formula (1), $A^1$ is an organic group containing an aromatic ring or an alicyclic group; $A^2$ is an organic group containing an aromatic ring; and m and n are each an integer. The diamine comprises a first diamine represented by the following formula (2) and a second diamine represented by the following formula (3).

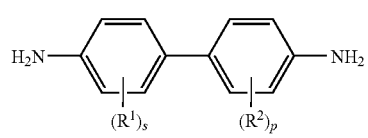
(2)

In the formula (2), $R^1$ and $R^2$ are each independently a fluorine-substituted alkyl group; and s and p are each independently an integer of 1 to 4.

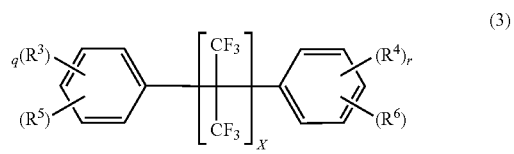
(3)

In the formula (3), $R^3$ and $R^4$ are each a hydroxyl group; $R^5$ and $R^6$ are each an amino group; q and r are each independently an integer of 1 to 4; and x is an integer of 0 or 1.

The use of the diamine including a fluorine-substituted alkyl group in the polyimide compound allows the highly imidized polyimide compound to be dissolved in a solvent. In addition, the use of the diamine including phenolic hydroxyl group helps increase the alkali solubility during polyimide formation. Furthermore, the use of the highly linear monomer makes it possible to keep the coefficient of linear thermal expansion of the polyimide low and allows adjustment of the coefficient of linear thermal expansion. The contraction during polyimide formation can be minimized by adjusting the imidization rate of the polyimide compound to 70% to 100%.

A photosensitizer may be added to the polyimide compound to enable patterning through exposure and development. Aside from the two diamine compounds, a third diamine compound may be added to adjust the coefficient of linear thermal expansion of the resulting polyimide and change the solubility of the polyimide in a solvent.

Accordingly, a flexible wiring board of the present invention comprises a conductor and a polyimide layer formed of a polyimide compound obtained by the reaction of an acid dianhydride with a diamine and represented by the following formula (1).

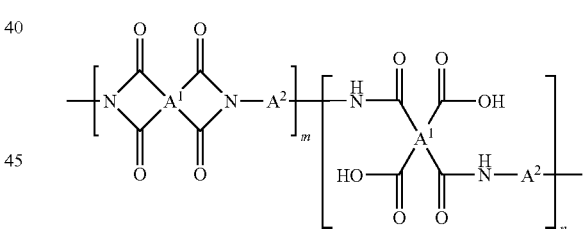
(1)

In the formula (1), $A^1$ is an organic group containing an aromatic ring or an alicyclic group; $A^2$ is an organic group containing an aromatic ring; and m and n are each an integer. The diamine comprises a first diamine represented by the following formula (2) and a second diamine represented by the following formula (3).

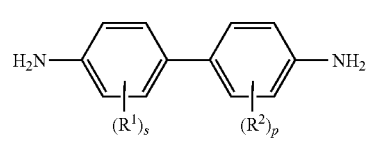
(2)

In the formula (2), $R^1$ and $R^2$ are each a fluorine-substituted alkyl group; and s and p are each independently an integer of 1 to 4.

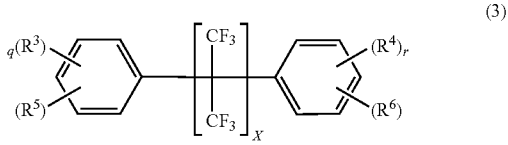

(3)

In the formula (3), $R^3$ and $R^4$ are each a hydroxyl group; $R^5$ and $R^6$ are each an amino group; q and r are each independently an integer of 1 to 4; and x is an integer of 0 or 1. The imidization rate of the polyimide compound being adjusted to 70% to 100%.

As described above, the curling of flexible wiring boards is caused by the difference in the coefficient of linear thermal expansion between the conductor and the polyimide to cover the conductor and by the internal stress that arises during polyimide formation on the conductor. In the flexible wiring board of the present invention, not only is the coefficient of linear thermal expansion of the polyimide on the conductor kept as low as that of the conductor, but it can also be adjusted by changing the type of monomer used. In addition, the imidization rate of the polyimide compound is adjusted to 70% to 100%. This makes the polyimide less susceptible to the internal stress caused by the contraction of polyimide film during polyimide formation. As a result, curl-free flexible wiring boards can be obtained.

ADVANTAGES OF THE INVENTION

The polyimide compound of the present invention uses diamine having trifluoromethyl groups in conjunction with diamine having phenolic hydroxyl groups, so that the coefficient of linear thermal expansion of the resulting polyimide compound can be kept as low as that of conductors and the coefficient of linear thermal expansion can be adjusted as desired. The presence of trifluoromethyl groups increases the solubility of the polyimide compound in a solvent and the presence of phenolic hydroxyl groups increases the solubility of the polyimide in an alkaline solution. The high imidization rate of the polyimide compound helps reduce the contraction of the polyimide film during polyimide formation and decreases the glass transition temperature of the resulting polyimide.

The flexible wiring board of the present invention has a low, adjustable coefficient of linear thermal expansion and has a reduced contraction of polyimide film, which makes the wiring board less susceptible to the internal stress. As a result, the curling of the flexible wiring board is prevented. When desired, a photosensitizer may be added to allow positive patterning by exposure to light followed by rinsing with an aqueous alkaline solution made with sodium hydroxide, potassium hydroxide, sodium carbonate, sodium bicarbonate, tetramethylammonium hydroxide and other bases.

REFERENCE NUMERALS

Figure 1:
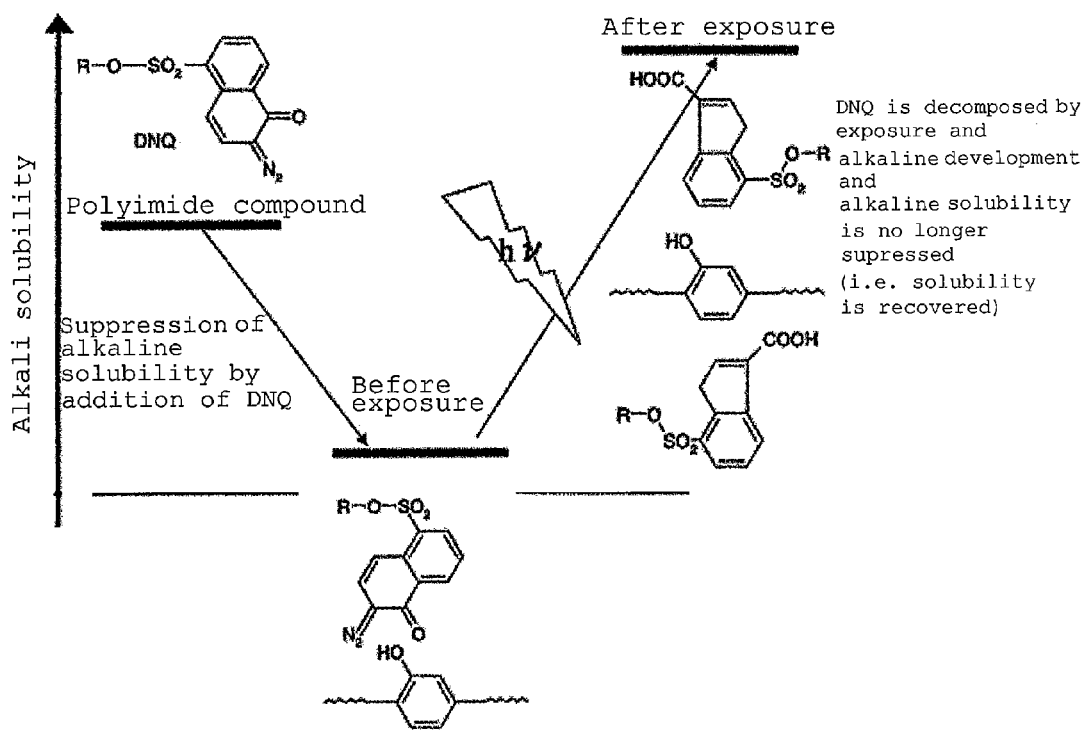
FIG. 1 is a diagram illustrating the principle of exposure of polyimide formed of a polyimide compound of the present invention to light.

1 Flexible wiring board
2 Conductor
3 Polyimide layer

BEST MODE FOR CARRYING OUT THE INVENTION

The polyimide compound and the flexible wiring board of the present invention will now be described in detail. It should be apparent to those skilled in the art that modifications may be made to the invention described herein without departing from the spirit and scope of the invention.

An exemplary polyimide compound of the present invention is obtained by addition polymerization of an acid dianhydride with a diamine, carried out in N-methyl-2-pyrrolidone (NMP) or other proper solvents, and is represented by the following formula (1).

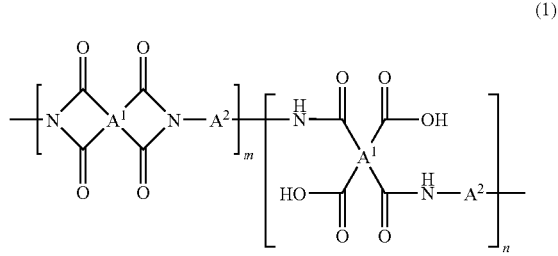

(1)

In the formula (1), $A^1$ is an organic group containing an aromatic ring or an alicyclic group; $A^2$ is an organic group containing an aromatic ring; and m and n are each an integer. While the diamine for use in the present invention generally comprises a first diamine represented by the following formula (2) and a second diamine represented by the following formula (3).

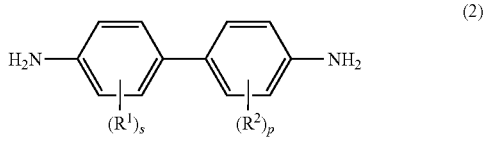

(2)

In the formula (2), $R^1$ and $R^2$ are each independently a fluorine-substituted alkyl group; and s and p are each independently an integer of 1 to 4.

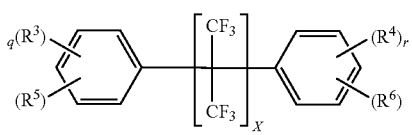

(3)

In the formula (3), $R^3$ and $R^4$ are each a hydroxyl group; $R^5$ and $R^6$ are each an amino group; q and r are each independently an integer of 1 to 4; and x is an integer of 0 or 1. The first diamine in this particular example is 2,2'-bistrifluoromethyl-4,4'-diaminobiphenyl (TFMB) (i.e., $R^1$ and $R^2$ are each a trifluoromethyl group, and s and p are each 1) and the second diamine is 4,4'-diamino-3,3'-biphenyldiol (HAB) (i.e., q and r are each 1, and x is 0) or 2,2-bis(3-amino-4-hydroxyphenyl)hexafluoropropane (BIS-AP-AF) (i.e., q and r are each 1, and x is 1). The imidization rate of this polyimide compound is adjusted to 70% to 100%. When desired, a photosensitizer may be added to the polyimide compound. This polyimide compound can be used to make a polyimide layer. To do this, the polyimide compound is dissolved in a proper solvent, such as N-methyl-2-pyrrolidone (NMP), and the solution is applied over a conductor, such as copper. The coating is then heated at an appropriate temperature to form the desired polyimide layer.

The polyimide compound may contain a polyamic acid component that has a structure shown by the formula (1). The polyamic acid component is obtained by reacting an acid dianhydride with a diamine in a solvent such as NMP. Thus, $A^1$ in the formula (1) is an organic group containing an aromatic ring that comes from the acid dianhydride and $A^2$ is an organic group containing an aromatic ring that comes from the diamine.

The acid dianhydride comprises a highly linear compound that has a lower coefficient of linear thermal expansion than the resulting polyimide. Examples of the acid dianhydride include pyromellitic dianhydride (PMDA), 3,4,3',4'-biphenyltetracarboxylic dianhydride (BPDA), 2,3,6,7-naphthalenetetracarboxylic dianhydride and 1,2,3,4-cyclobutanetetracarboxylic dianhydride. A suitable acid dianhydride may be selected depending on the coefficient of linear thermal expansion of the desired polyimide. The use of the highly linear acid dianhydride as a monomer component of the highly linear polyimide decreases the coefficient of linear thermal expansion of the resulting polyimide.

As described above, the diamine to make the exemplary polyimide compound of the invention contains TFMB as the first diamine and HAB or BIS-AP-AF as the second diamine. The diamine may further comprise a third diamine to adjust the solubility of the polyimide compound in solvents and the coefficient of linear thermal expansion of the polyimide.

TFMB is a highly linear diamine having trifluoromethyl groups. Trifluoromethyl groups in TFMB are bulky substituents that serve to weaken interactions between molecular chains. Thus, the introduction of trifluoromethyl groups into the polyimide increases the solubility of the polyimide in solvents.

A polyimide composed of highly linear acid dianhydride and highly linear diamine tends to have a low coefficient of linear thermal expansion. In general, a polyimide with a low coefficient of linear thermal expansion does not readily dissolve in solvents such as NMP. For example, a polyimide composed of highly linear PMDA and highly linear paraphenylenediamine does not dissolve in NMP.

Thus, TFMB may be added for the purpose of increasing the solubility of polyimides into solvents. For example, a completely imidized polyimide composed of PMDA and TFMB does not dissolve in NMP and forms an opaque gel. A completely imidized polyimide composed of PMDA, BPDA and TFMB does not dissolve in NMP and forms a clear gel. The polyimide composed of PMDA, BPDA and TFMB has a coefficient of linear thermal expansion of 12.82 ppm/° C. Thus, the use of TFMB helps decrease the coefficient of linear thermal expansion of polyimides and increase the solubility of polyimides in solvents.

The amount of TFMB in the diamine is preferably 45 mol % or more though the amount may vary depending on the type of the conductor, acid dianhydride and third diamine described later. If TFMB is added in amounts less than 45 mol %, the solubility of the diamine in solvents is decreased, so that the imidization rate of the polyimide compound has to be decreased. The decrease in the imidization rate leads to significant condensation reaction taking place during polyimide formation. As a result, the contraction of polyimide deposited over the conductor becomes significant and internal stress builds up, causing the flexible wiring board to curl.

The first diamine for use in the polyimide compound of the present invention is not limited to TFMB and may be any linear diamine that can increase the solubility of the polyimide compound in solvents such as NMP. For example, the substituents $R^1$ and $R^2$ in the formula (2) may each be a fluorine-substituted alkyl group, such as monofluoromethyl group, difluoromethyl group, pentafluoroethyl group, heptafluoropropyl group and nonafluorobutyl group. These alkyl groups may be straight-chained or branched.

HAB is a highly linear diamine having phenolic hydroxyl groups. Phenolic hydroxyl groups provides high solubility in alkaline solutions. Thus, the use of HAB can not only decrease the coefficient of linear thermal expansion, but can also increase the solubility of the polyimide in alkaline solutions. In comparison, BIS-AP-AF is a highly bent diamine having phenolic hydroxyl groups and trifluoromethyl groups. Thus, the use of BIS-AP-AF can simultaneously increase the solubility of the polyimide both in solvents and in alkaline solutions. A photosensitizer may be added to the polyimide compound to allow positive patterning by exposure and alkali development.

The amount of HAB in the diamine is preferably 1 mol % or more, more preferably 20 mol % or more, though the amount may vary depending on the amount of the other diamines. When present in amounts of 20 mol % or more, HAB can significantly increase the solubility of the polyimide compound in alkaline solutions. The amount of BIS-AP-AF is preferably in the range of 1 mol % to 20 mol % though the amount may vary depending on the amount of the other diamines. If BIS-AP-AF is added in amounts greater than 20 mol %, the resulting polyimide film may have too high a coefficient of linear thermal expansion, causing the flexible wiring board to curl. In comparison, BIS-AP-AF, when present in amounts less than 1 mol %, cannot provide sufficient solubility in solvents or alkaline solutions. HAB and BIS-AP-AF may be a diamine having phenolic hydroxyl groups since isocyanate is not used in making the polyimide components.

The third diamine is added to adjust the coefficient of linear thermal expansion of the polyimide formed from the above acid dianhydride and the above diamine. As described above, the coefficient of linear thermal expansion of the polyimide composed of the highly linear acid dianhydride and the highly linear diamine can be kept as low as that of the conductor.

For example, copper foil, a commonly used conductor, has a coefficient of linear thermal expansion of about 20 ppm/° C. whereas the polyimide formed from an acid dianhydride composed of 50 mol % PMDA and 50 mol % BPDA and a diamine composed of 75 mol % TFMB and 25 mol % HAB has a coefficient of linear thermal expansion of 13.8 ppm/° C. The lower coefficient of linear thermal expansion of the polyimide causes the flexible wiring board to curl with the copper inside. By adding a proper amount of the bent third diamine, the coefficients of linear thermal expansion of the two elements can be matched with each other. The addition of the bent third diamine also increases the solubility of the polyimide in solvents, so that the highly imidized polyimide compound can be made soluble in solvents and the contraction of the polyimide film during polyimide formation can be minimized.

The second diamine for use in the polyimide compound of the present invention is not limited to HAB or BIS-AP-AF and may be any diamine that has a well-balanced coefficient of linear thermal expansion relative to the substrate film and that can increase the solubility of the polyimide in alkaline solutions. The number of the substituted hydroxyl group may be 1 or 3 or more.

A polyimide composed only of highly linear compounds such as TFMB and HAB has a significantly decreased coefficient of linear thermal expansion. In such a case, as a third diamine, added is a compound which helps increase the coefficient of linear thermal expansion of polyimide constituted of a bent diamine, thereby adjusting the coefficient of linear thermal expansion of the polyimide. Such a bent compound is highly soluble in solvents such as NMP and can be used to increase the solubility of the polyimide. Such a compound can also increase the adhesion of the polyimide to the conductor. Examples of the bent third diamine include BIS-AP-AF, 1,3-bis(3-aminophenoxy)benzene (APB), 1,3-bis(4-aminophenoxy)benzene, 1,4-bis(4-aminophenoxy)benzene, 9,9-bis(4-aminophenyl)fluorene, 9,9-bis[4-(4-aminophenoxyphenyl)fluorene], 1,3-bis(3-aminopropyl) -1,1,3,3-tetramethyldisiloxane, diaminosiloxane, 2,2-bis[4-(4-aminophenoxy)phenyl]hexafluoropropane, 2,2-bis[4-(4-aminophenoxy)phenyl]propane, 4,4'-bis(4-aminophenoxy) biphenyl, 3,4'-diaminodiphenylether, bis[4-(4-aminophenoxy)phenyl]sulfone, bis[4-(3-aminophenoxy) phenyl]sulfone, 4,4'-diaminodiphenylsulfone and 4,4'-diaminodiphenylsulfide. On the other hand, a polyimide composed of TFMB and highly bent BIS-AP-AF will have too high a coefficient of linear thermal expansion when the amount of BIS-AP-AF is excessively large. In such a case, as a third diamine, added is a compound which helps decrease the coefficient of linear thermal expansion of polyimide constituted of a highly linear diamine, thereby adjusting the coefficient of linear thermal expansion of the polyimide. Examples of the highly linear compound include HAB, p-phenylenediamine, o-tolidine, m-tolidine, 3,3'-dimethyl-4,4'-diaminobiphenyl-6,6'-disulfonic acid, trans-1,4-cyclohexanediamine, 3,3'-dimethoxy-4,4'-diaminobiphenyl, o-tolidinesulfone, 1,5-diaminonaphthalene, 1,4-diaminonaphthalene and 2,7-diaminofluoerene. The third diamine can be used to adjust the coefficient of linear thermal expansion of the polyimide by using a proper compound in a proper amount in accordance with the used conductor.

The acid dianhydride and the diamine are dissolved in a solvent such as NMP for addition polymerization. While the solvent used for this purpose may be any aprotic amide solvent, such as NMP and N,N'-dimethylacetamide, or any phenol solvent, such as cresol, NMP is preferred to ensure safety. The solvent may be mixed with xylene, toluene, ethylene glycol monoethyl ether and other solvents.

Once synthesized, the polyimide compound preferably has a specific viscosity of 0.3 dl/g or higher. The polyimide compound with a specific viscosity of less than 0.3 dl/g has too small a degree of polymerization to ensure strength of the resulting film. The specific viscosity of the polyimide compound can be adjusted by varying the molar ratio of the diamine to the acid dianhydride. The molar ratio is preferably in the range of 0.8 to 1.2. If the molar ratio does not fall in this range, the degree of polymerization becomes too small to ensure sufficient film strength. An end-capping agent such as phthalic anhydride and aniline may be added to effectively adjust the specific viscosity.

The conductor to be coated with the polyimide compound may be made of a metal material such as copper, aluminum and iron. These metals may be alloyed with beryllium, nickel, chromium or tungsten to make alloys such as beryllium copper and stainless steel. The foils made of these metals may be matted, plated with nickel or zinc, or oxidized to improve the adhesion. The foils may be chemically surface-treated with aluminum alcoholate, aluminum chelate, silane-coupling agent or imidazole.

A photosensitizer may be added to the polyimide compound to impart photosensitivity to the resulting polyimide compound. The photosensitizer may be an o-quinonediazide compound. The polyimide compound containing an o-quinonediazide compound changes its solubility in alkaline solutions upon exposure to light. The polyimide containing an o-quinonediazide compound has a low alkali solubility prior to exposure but, upon exposure to light, the molecular structure of the o-quinonediazide compound is changed to form a ketene, which in turn reacts with an alkaline solution to form a carboxylic acid. The carboxylic acid further reacts with the alkaline solution, causing the polyimide to dissolve in the alkaline solution. In this manner, the alkali solubility of the polyimide compound increases upon exposure to light.

FIG. 1 is a diagram illustrating the underlying mechanism of the alkali solubility of the polyimide compound of the present invention. As shown, the polyimide compound has a relatively high alkali solubility because of the presence of the phenolic hydroxyl group. When an o-quinonediazide (DNQ) photosensitizer is present, the hydroxyl group of HAB or BIS-AP-AF forms a hydrogen bond with the o-quinonediazide compound. As a result, the phenolic hydroxyl group responsible for the high alkali solubility is protected and the polyimide compound becomes less soluble in an alkali. When this polyimide compound is exposed to light, the o-quinonediazide compound changes its molecular structure so that the alkali solubility of the polyimide compound is recovered. Thus, the addition of the o-quinonediazide photosensitizer enables positive patterning on the flexible wiring board by exposing the flexible-wiring board to light and then applying an aqueous alkaline solution made with sodium hydroxide, potassium hydroxide, sodium carbonate, sodium bicarbonate, tetramethylammonium hydroxide and other bases.

The o-quinonediazide compound may be any compound containing an o-quinonediazide backbone, including 2,3,4-trihydroxybenzophenone o-naphthoquinonediazide-4-sulfonic acid ester, 2,3,4-trihydroxybenzophenone o-naphthoquinonediazide-5-sulfonic acid ester and 2,3,4-trihydroxybenzophenone o-benzoquinonediazide-4-sulfonic acid ester. Even in the presence of the photosensitizer, the curling of the flexible wiring board can be effectively prevented by maintaining the low coefficient of linear thermal expansion of the polyimide.

Other agents may further be added to the polyimide compound, such as anti-corrosion agents to prevent corrosion of the conductor and epoxies to increase the adhesion of the polyimide to the conductor. Even in the presence of such agents, the curling of the flexible wiring board can be effectively prevented by maintaining the low coefficient of linear thermal expansion of the polyimide.

One exemplary process for the production of the polyimide compound of the present invention will now be described. First, an acid dianhydride and a diamine comprising TFMB and HAB or BIS-AP-AF are dissolved in a solvent such as NMP. The solution is stirred at room temperature to 100° C. for a predetermined period of time to allow the acid dianhydride and the diamine to react with each other to obtain a viscous polyimide precursor.

To the polyimide precursor, an azeotropic agent such as toluene and xylene is added and the mixture is stirred while being heated to 180° C. or higher to dehydrate the polyamic acid component and obtain a polyimide component in which part or entire polyamic acid rings are closed. If necessary, an imidization catalyst may be added, including a tertiary amine such as triethylamine, a basic catalyst such as aromatic isoquinoline and pyridine and an acidic catalyst such as benzoic acid and parahydroxybenzoic acid. These catalysts may be added either individually or in combination. Alternatively, a chemical imidization agent, such as acetic anhydride/pyridine and dicyclohexylcarbodiimide, each a dehydration-cyclization reagent, may be used to close the polyamic acid rings. In this manner, the polyimide compound of the general formula (1), namely, a complete polyimide or a polyimide compound containing polyamic acid component, can be obtained. The term "imidization rate" is defined as the proportion of the polyamic acid component having its rings closed with respect to the polyimide component with unclosed rings. The imidization rate can be controlled by adjusting parameters such as heating temperature and heating time during polyimide formation, concentration of chemical imidization agent and stirring time. The imidization rate can be calculated by analyzing the polyimide precursor before partial imidization and the polyimide compound after partial imidization by Fourier Transform Infrared Spectroscopy (FT-IR) and using the equation below. 100% imidization rate is given as the absorbance of the polyimide obtained by heating the polyimide precursor at a high temperature of 300° C. or above to complete the imidization process.

The polyimide compound applied to the conductor may be heated to cause the dehydration reaction and thereby form the polyimide over the conductor.

As described above, the contraction of the polyimide compound of the present invention during polyimide formation can be minimized by adjusting the imidization rate to 70% to 100%. In addition, the use of the highly linear acid dianhydride and highly linear diamine enables formation of polyimide that has a coefficient of linear thermal expansion as low as that of the conductor. Furthermore, the coefficient of linear thermal expansion of the polyimide can be adjusted by using different combinations of acid dianhydrides and diamines.

The coefficient of linear thermal expansion of the polyimide deposited over the conductor can be adjusted as desired by changing the amount of TFMB, HAB or BIS-AP-AF and by changing the amount of the third diamine. For example, a polyimide obtained by using 20 mol % of 4,4'-diamino-3,3'-biphenyldiol and 45 mol % to 80 mol % of 2,2'-bistrifluoromethyl-4,4'-diaminobiphenyl as the diamines, along with 35 mol % to 0 mol % of APB as the third diamine, has a coefficient of linear thermal expansion of 8 ppm/° C. to 33 ppm/° C.

The imidization rate affects the solubility of the polyimide compound containing a photosensitizer in alkaline solutions. For example, a polyimide compound formed with the imidization rate adjusted to 80% is easily and selectively removed by an alkaline solution in the exposed area. The imidization rate is preferably 70% or higher since the polyimide with too low an imidization rate tends to dissolve in an alkaline solution not only in the exposed area, but also in the non-exposed area.

The polyimide compound so obtained is applied to the conductor and imidized to make a flexible wiring board in which the polyimide serves as an insulative layer. The coefficient of linear thermal expansion of the polyimide can be made as low as that of the conductor by using the highly linear acid dianhydride and highly linear diamine. In addition, the coefficient of linear thermal expansion of the polyimide can be adjusted by using different combinations of acid dianhydrides and diamines. In this manner, the curling of the flexible wiring board caused by the difference in the coefficient of linear thermal expansion between the conductor and the polyimide and by the internal stress that builds up as the polyimide $$\text{Imidization rate} = \frac{\left(\frac{\text{Absorbance of imidocarbonyl near 1778 cm}^{-1} \text{ for the synthetic composition}}{\text{Absorbance of benzene nuclei near 1490 cm}^{-1} \text{ for the synthetic composition}}\right)}{\left(\frac{\text{Absorbance of imidocarbonyl near 1778 cm}^{-1} \text{ when the composition is heated to 300° C. or above}}{\text{Absorbance of benzene nuclei near 1490 cm}^{-1} \text{ when the composition is heated to 300° C. or above}}\right)} \times 100$$

The imidization rate of the polyimide compound is preferably adjusted to 70% to 100%. The polyimide with an imidization rate of lower than 70% is subjected to a significant internal stress during polyimide formation. As a result, the flexible wiring board comprising the polyimide compound of the present invention deposited over the conductor will curl. The curling of the flexible wiring board caused by the internal stress can be prevented by adjusting the imidization rate in the deposition of the polyimide compound of the present invention over the conductor.

The polyimide compound of the present invention is dissolved in a solvent such as NMP for application to a conductor such as copper. The above-described photosensitizer may be added to the polyimide compound.

The polyimide compound dissolved in the solvent may be applied to the conductor by any known technique, including knife coater and curtain coater.

contracts, can be prevented. Moreover, the low glass transition temperature of the polyimide obtained by the polyimide compound of the present invention makes it possible to plasticize the polyimide at relatively low temperatures when desired. As a result, the conductor is less affected.

An exemplary flexible wiring board using the polyimide compound of the present invention will now be described with reference to the accompanying drawings.

Figure 2:
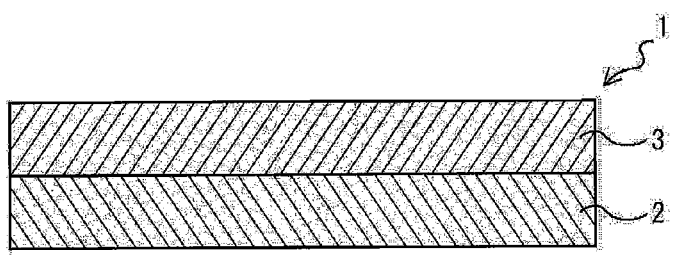
FIG. 2 is a cross-section of a flexible wiring board of the present invention.

Referring to FIG. 2, a flexible wiring board of the present invention is shown in its cross-section. As shown, the flexible wiring board 1 includes a conductor 2, such as a copper foil, and a polyimide layer 3 made of the above-described polyimide compound and deposited on the conductor 2.

The polyimide layer 3 is formed by imidizing the above-described polyimide compound on the conductor 2. The polyimide layer 3 is formed of highly linear monomers and thus has a lower coefficient of linear thermal expansion than the conductor 2. The coefficient of linear thermal expansion of the polyimide layer 3 can be varied as desired by using different monomers. The imidization rate of the polyimide compound has been adjusted to 70% to 100%, so that the polyimide layer 3 is less susceptible to internal stress that arises as the polyimide contracts during polyimide formation.

Since the polyimide layer 3 is made of the above-described polyimide compound, the above-described photosensitizer may be added to the polyimide compound to enable positive patterning by exposure to light and alkaline development. For example, the polyimide compound may contain the above-described o-quinonediazide compound. If present, the o-quinonediazide compound forms a hydrogen bond with the hydroxyl group of HAB or BIS-AP-AF. As a result, the phenolic hydroxyl group responsible for the high alkali solubility is protected and the polyimide compound becomes less soluble in an alkali. When this polyimide compound is exposed to light, the o-quinonediazide compound changes its molecular structure so that the alkali solubility of the polyimide compound is recovered. Thus, the addition of the o-quinonediazide compound as the photosensitizer enables positive patterning, in which the polyimide compound is exposed to light and is then developed in an alkaline solution to selectively dissolve the polyimide compound.

In one patterning technique, the polyimide compound applied to the conductor 2 is dried and a mask layer is placed over the polyimide layer so that the polyimide compound is exposed to light in the area where it needs to be removed. Upon exposure to light, the alkali solubility of the polyimide compound increases in the exposed area. The polyimide film is then immersed in an alkaline solution to remove the polyimide compound in the exposed area, leaving the polyimide compound in the desired area. The remaining polyimide compound is then imidized to form the polyimide layer 3 of desired shape to serve as the insulative layer.

EXAMPLES

The polyimide compound and the flexible wiring board of the present invention will now be described with reference to specific examples, which are not intended to limit the scope of the invention in any way and to which modifications may be made without departing from the spirit of the invention.

Example 1

Solubility of Polyimide

Several polyimide compounds were prepared by reacting different acid dianhydrides with different diamines including TFMB. Specifically, the compounds were prepared as follows. In a 500 ml four-necked flask equipped with a stirrer and a nitrogen tube, a stoichiometric amount of one of the diamines was dissolved in NMP at room temperature under a stream of nitrogen (flow rate=50 ml/s). Once the diamine was completely dissolved in NMP, a stoichiometric amount of one of the acid dianhydrides was gradually added to the reaction vessel in small portions and the mixture was stirred at room temperature for not less than 1 hour to carry out polymerization. This gave a viscous polyamic acid as the polyimide precursor. The concentration of the polyamic acid in the reaction vessel was controlled to 10 to 15 wt %, giving a total amount of 250 g. A Liebig tube, a distilling column and a toluene tube were then attached to the reaction vessel. The polyamic acid solution was heated to 80° C. and was stirred for 30 minutes at the temperature. Subsequently, 15 ml toluene was added and the mixture was heated to 190° C. and was maintained at that temperature. Once the toluene was evaporated, additional toluene was added dropwise and the column top temperature was adjusted to 90° C.±10° C., the azeotropic points of toluene and water. The mixture was kept at 190° C. for a specific period of time and heating was stopped. The collected toluene (containing NMP) and water were accurately weighed, and fresh NMP was added to replenish the lost NMP and put the concentration back to 10 wt %. The mixture was then cooled to 100° C. and transferred to a sample bottle. The solubility of the resulting product in NMP was determined at room temperature.

The acid dianhydrides used in Example 1 are PMDA, BPDA, 3,3', 4,4'-diphenylsulfonetetracarboxylic dianhydride (DSDA). The diamines used in Example 1 are TFMB, par-aphenylenediamine (PDA), 4,4'-diaminobenzanilide (DABA), 1,5-diaminonaphthalene (DAN), 4,4'-diaminodiphenyl ether (ODA), 1,3-bis(3-aminophenoxy)benzene (APB), and bis[4-(3-aminophenoxy)phenyl]sulfone (BAPS-M).

The results of the evaluation of the resulting polymers are shown in Table 1 below. In Table 1, the acid dianhydrides are horizontally arranged so that the coefficient of linear thermal expansion of the resulting polyimide increases from the left to the right. The diamines are vertically arranged so that the coefficient of linear thermal expansion (CTE) of the resulting polyimide increases from the top to the bottom.

TABLE 1

| | | | Low <-CTE-> High Acid dianhydride | | | |
|---|---|---|---|---|---|---|
| | | | PMDA | PMDA/BPDA 50.5/50.5 | BPDA | DSDA |
| High <-CTE-> Low | Diamine | PDA | Precipitated | Precipitated | Precipitated | — |
| | | DABA | Precipitated | Precipitated | Precipitated | — |
| | | TFMB | Gelated (opaque) (7.9 ppm/° C.) | Gelated (transparent) (12.82 ppm/° C.) | Gelated (transparent) (27.4 ppm/° C.) | — |
| | | DAN | Precipitated | Precipitated | Precipitated | — |
| | | ODA | Precipitated | Precipitated | Precipitated | — |
| | | APB | — | — | Dissolved (48.9 ppm/° C.) | Dissolved |
| | | BAPS-M | — | — | Dissolved | Dissolved |

— not measured. The numbers in brackets are coefficients of linear thermal expansion (CTE) (averaged over 100° C. to 150° C.)

As shown in Table 1, most of the resulting polyimides precipitated or gelated. Only polyimides formed from combinations of acid dianhydrides BPDA and DSDA and diamines APB and BAPS-M were soluble in NMP. These polyimides each have a higher coefficient of linear thermal expansion than the conductor, so that the flexible wiring boards made by depositing these polyimides on the conductor are susceptible to curling.

In comparison, the polyimides formed from combinations of acid dianhydrides PMDA and BPDA and diamine TFMB absorbed the solvent to form a gel, though not soluble in the solvent. These polyimides each have a coefficient of linear thermal expansion comparable to the conductor. Thus, these polyimide compounds can be made soluble in the solvent by decreasing the imidization rate below 100% or adding a compound soluble in the solvent.

Example 2

Alkali Solubility

To form a positive pattern with the polyimide compound, diamines were selected that can make the polyimide compound soluble in an alkaline solution when the polyimide compound was applied to the conductor. In Example 2, the acid dianhydrides and the diamines that showed relatively high solubility in NMP in Example 1 were used. Specifically, the acid dianhydrides used were PMDA and BPDA and the diamine used was TFMB. A diamine with an acid component was also used to provide the solubility in an alkaline solution. Specifically, HAB and BIS-AP-AF, each a diamine having phenolic hydroxyl groups, and 5,5'-methylenebis(anthranilic acid) (MBAA), a diamine having carboxylic acid groups, were used.

In a similar manner to Example 1, the acid dianhydrides PMDA and BPDA, the diamine TFMB and the diamine HAB, BIS-AP-AF or MBAA were reacted with each other to obtain polyimide compounds with specific imidization rates. Each polyimide compound was evaluated for the solubility in NMP. The varnishes made from the respective polyimide compounds were individually applied to a copper foil to a thickness of 10 μm and were dried at 100° C. for 10 minutes. The foils were heated at 230° C. for 30 minutes to make flexible wiring boards comprising the polyimide layer formed on the copper foil. The flexible wiring boards were then immersed in a 10 wt % aqueous potassium hydroxide solution at room temperature for 3 minutes to evaluate the solubility of the respective polyimides. The results are shown in Table 2 below.

The results indicate that while each polyimide is soluble in the alkaline solution, the polyimides using HAB or BIS-AP-AF are preferred in terms of the solubility in the NMP solvent.

Example 3

Imidization Rate

Figure 3:
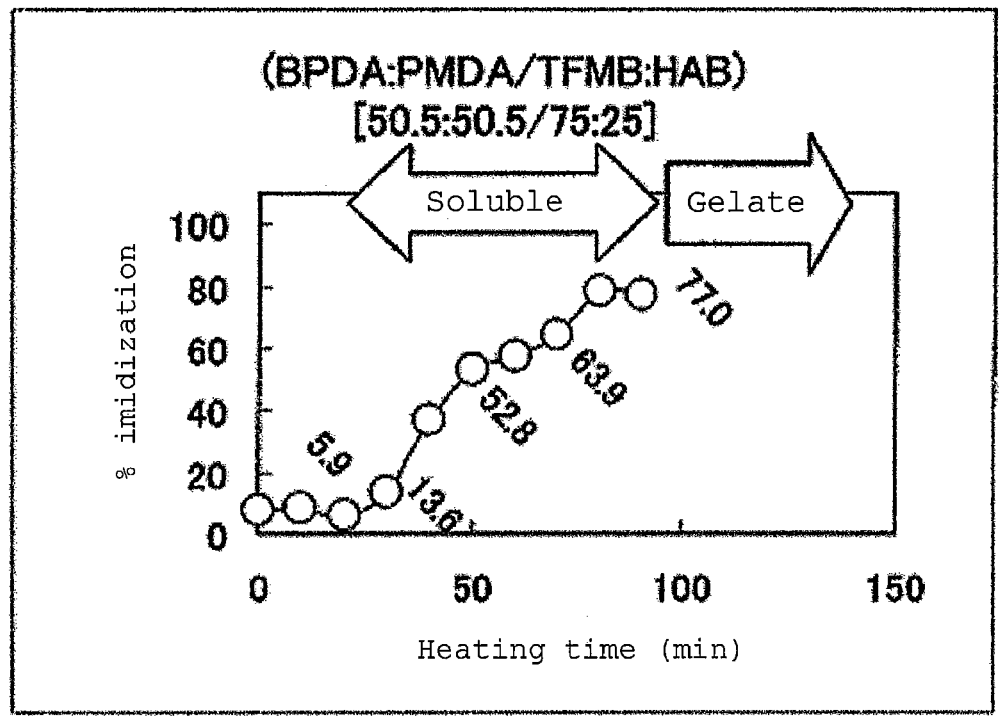
FIG. 3 is a diagram showing the relationship between the heating time and the imidization rate in a polyimide compound of the present invention made with BPDA, PMDA, TFMB and HAB.
Figure 4:
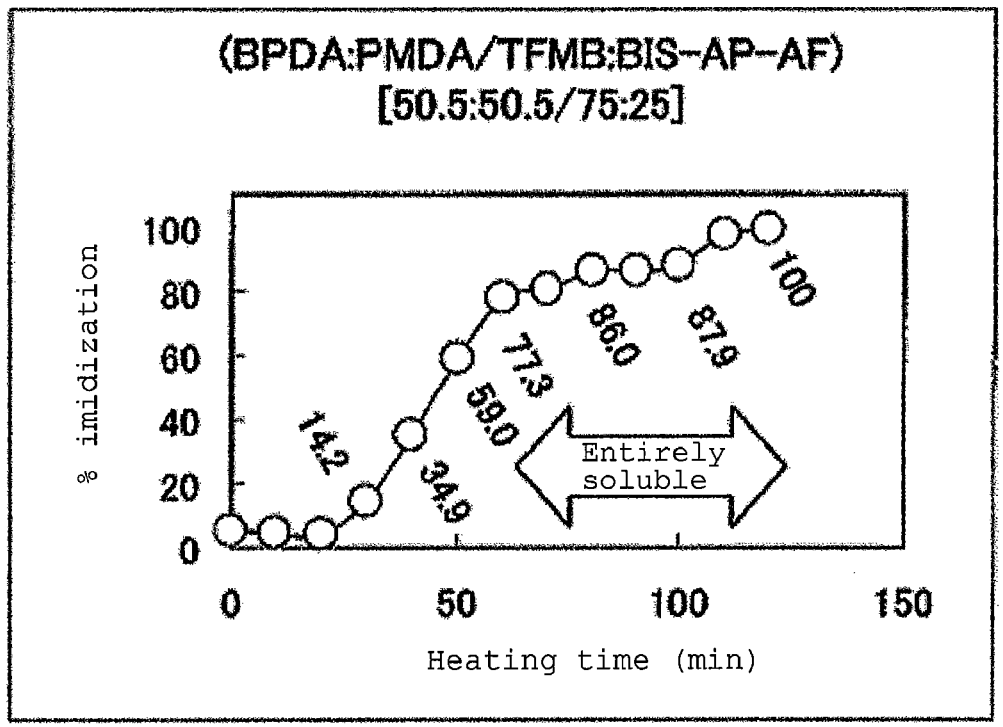
FIG. 4 is a diagram showing the relationship between the heating time and the imidization rate in a polyimide compound of the present invention made with BPDA, PMDA, TFMB and BIS-AP-AF.
Figure 5:
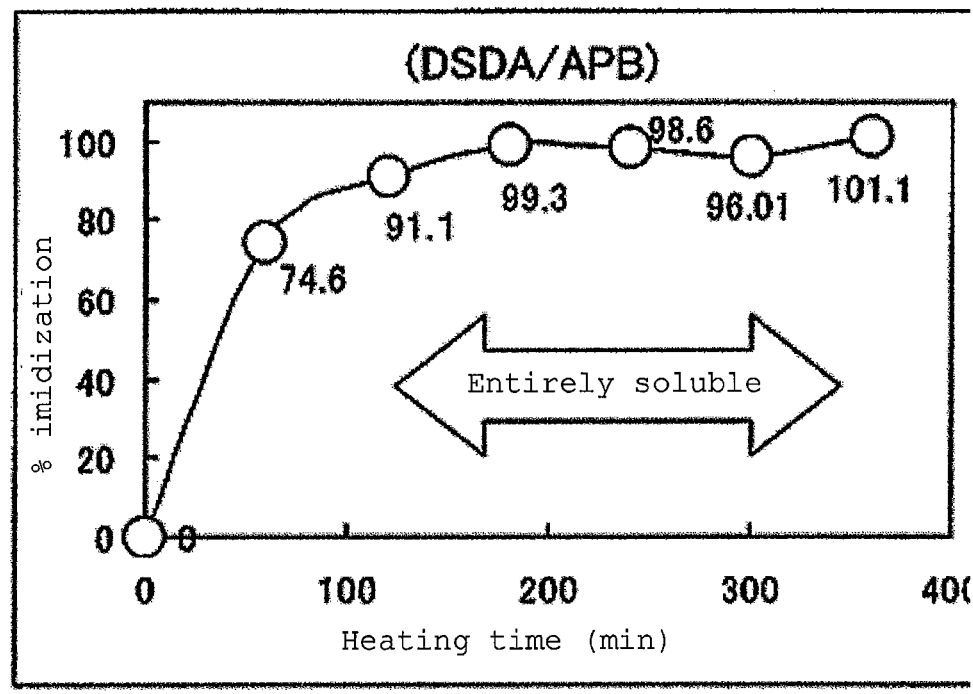
FIG. 5 is a diagram showing the relationship between the heating time and the imidization rate in a polyimide compound made with DSDA and APB.

In a similar manner to Example 1, polyimide compounds with specific imidization rates were prepared by using the combinations of reactants that produced the favorable results in Examples 1 and 2: The acid dianhydrides PMDA and BPDA, the diamine TFMB and the diamine HAB or BIS-AP-AF. The imidization rate of each polyimide compound was adjusted by varying the heating time. The relationship between the imidization rate and the solubility in NMP was examined for each compound. The results are shown in FIGS. 3 and 4. For comparison, the relationship between the imidization rate and the solubility in NMP for the polyimide compound formed from DSDA and APB is shown in FIG. 5.

As shown in FIG. 3, which shows the relationship between the heating time and the imidization rate, the polyimide compound dissolved in NMP when the imidization rate was about 80% or below. In comparison, the polyimide compound gelated when the imidization rate was higher than 80%. It has been demonstrated that the polyimide compound made without TFMB precipitated at an imidization rate of several percent. The polyimide made using HAB is composed only of highly linear monomers and generally precipitates at a low imidization rate. It turns out that the imidization rate at which the compound precipitates can be significantly improved by adding TFMB. It has also been proven that substitution of HAB with BIS-AP-AF, a bent compound having trifluoromethyl groups, can make the polyimide compound soluble in the solvent when the imidization rate is as high as 100%. As shown in Table 2, the polyimide compounds of FIGS. 3 and 4 each has substantially the same coefficient of linear thermal expansion as the copper foil conductor. In addition, these compounds have been proven to have an imidization rate of 70% or higher and brings about less internal stress, so that they are less susceptible to curling. As opposed to this, the polyimide formed from DSDA and APB and having an imidization rate of 100% has a coefficient of linear thermal expansion of 50.8 ppm/° C., though the compound is free of internal stress. Thus, the flexible wiring board comprising the polyimide deposited on the conductor tends to curl due to the

TABLE 2

| Composition | Acid dianhydride | | Diamine | | CTE | Alkali solubility | Solubility in NMP |
| --- | --- | --- | --- | --- | --- | --- | --- |
| | 50.5 | 50.5 | 75 | 25 | | | |
| (A) | PMDA | BPDA | TFMB | HAB | 13.8 ppm/° C. | Dissolved | Dissolved - Gelated (transparent) |
| (B) | PMDA | BPDA | TFMB | MBAA | 25.0 ppm/° C. | Dissolved | Gelated (transparent) - Gelated (opaque) |
| (C) | PMDA | BPDA | TFMB | BIS-AP-AF | 20.0 ppm/° C. | Dissolved | Dissolved |

CTE = coefficient of linear thermal expansion difference in the coefficient of linear thermal expansion between the polyimide and the conductor.

Example 4

Curling Property

In a similar manner to Example 1, different polyimide compounds with different diamine compositions were prepared. Each compound was applied to a copper foil conductor and was dried at 100° C. for 10 minutes. Each foil was then heated at a top temperature of 280° C. for 30 minutes under a nitrogen atmosphere to imidize the unimidized portions of the polyimide compound. The same polyimide compounds with 100% imidization rate were cured under the same condition. From each of the resulting flexible wiring boards, a 10 cm×10 cm piece was cut out and each sample piece was left in a controlled atmosphere (25° C. and 65% RH) for 24 hours. Subsequently, each sample piece was evaluated for the curling. The results are shown in Table 3. In Table 3, "h" indicates the average height of the corners of the curled copper foil above the level surface. "φ" indicates the diameter of the copper foil curled up into a pencil-like shape. "+" indicates that the flexible wiring board curled with the polyimide inside, whereas "−" indicates that the flexible wiring board curled with the copper foil inside.

ing the coefficient of linear thermal expansion of the polyimide with that of the conductor. To prevent the curling, the effect of the internal stress caused by imidization must be minimized and, to that end, the polyimide compound needs to be imidized to the highest degree possible prior to application to the conductor, given that it remains soluble in the solvent. The results shown in (a) through (d) in Table 3 suggest that the curling in the flexible wiring boards formed from highly linear monomers can be prevented at imidization rate of about 70% by adding a bent monomer, such as APB, to change their chemical composition. The results also indicate that by substituting BIS-AP-AF, a bent compound having trifluoromethyl groups, for HAB, the imidization rate can be increased to 100%. It has also been shown that the degree of curling can be adjusted by changing the diamine composition.

Example 5

Adjustment of Coefficient of Linear Thermal Expansion

Since different conductors have different coefficients of linear thermal expansion, we tried to adjust the coefficient of linear thermal expansion of the polyimide compound to suit the type of the conductor used. In a similar manner to Example 1, different polyimides were obtained by using the

TABLE 3

|  | Acid dianhydride composition (mol %) | | Diamine composition (mol %) | | | | CTE of polyimide (ppm/° C.) | Curl property | |
|---|---|---|---|---|---|---|---|---|---|
|  |  |  |  |  |  |  |  | During polyimide formation from polyimide composition/ Imidization rate | During polyimide formation from polyimide precursor (Imidization rate = 0%) |
|  | PMDA | BPDA | TFMB | HAB | APB | BIS-AP-AF |  |  |  |
| (a) | 50.5 | 50.5 | 75 | 25 | 0 | 0 | 13.8 |  |  |
| (b) | 50.5 | 50.5 | 65 | 25 | 10 | 0 | 18.2 | −3.75 mm (h)/ 74.4% | +29 mm (φ) |
| (c) | 50.5 | 50.5 | 55 | 25 | 20 | 0 | 24.8 | −0.25 mm (h)/ 72.1% | +23 mm (φ) |
| (d) | 50.5 | 50.5 | 45 | 25 | 30 | 0 | 30.5 | +15.75 mm (h)/ 77.6% | +19 mm (φ) |
| (e) | 50.5 | 50.5 | 75 | 0 | 0 | 25 | 20.0 | −2.00 mm (h)/ 100% | +20 mm (φ) |
| (f) | 50.5 | 50.5 | 80 | 0 | 0 | 20 | 14.3 | −14.5 mm (h)/ 100% | +20 mm (φ) |

CTE = coefficient of linear thermal expansion

Figure 6:
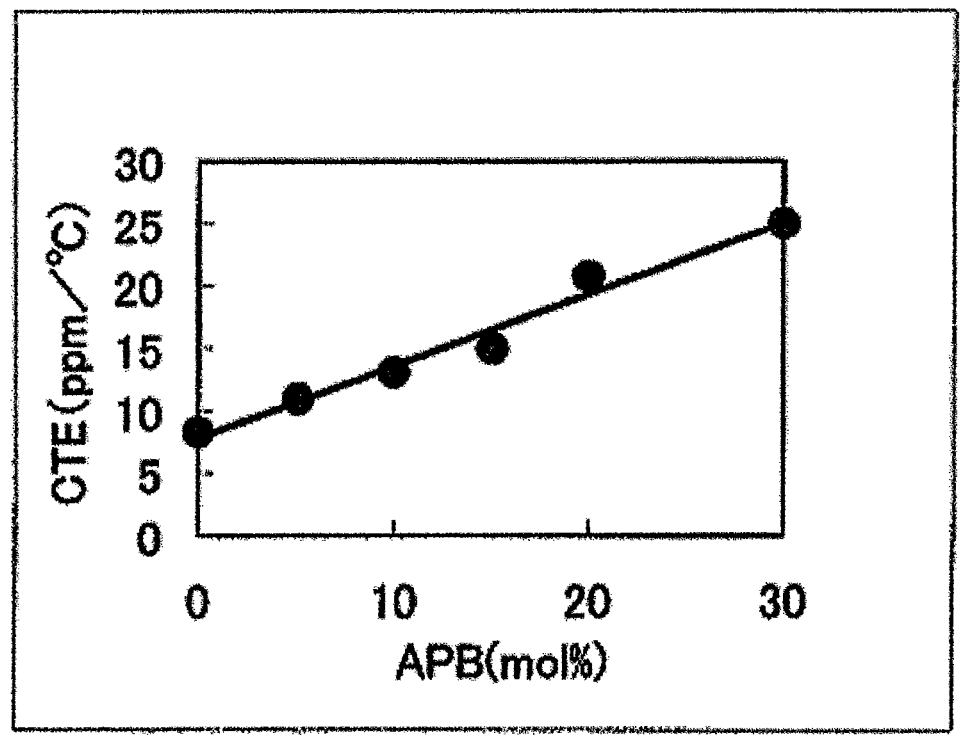
FIG. 6 is a diagram showing the relationship between the amount of APB and the coefficient of linear thermal expansion.

The results indicate that the polyimide compounds with the same coefficient of linear thermal expansion curl to different degrees depending on whether the polyimide layers have been partially imidized or not. As described above, the curling of the flexible wiring boards is caused by the internal stress that arises as the polyimide contracts during polyimide formation. It has therefore been proven that the curling of the flexible wiring boards cannot be prevented by simply matchacid dianhydrides BPDA and PMDA and the diamines TFMB, HAB and APB and by varying the respective proportions of TFMB and APB. The coefficient of linear thermal expansion of each polyimide was determined. Glass transition temperature was also determined by tangent method. The results are shown in Table 4 below and the relationship between the amount of APB to serve as the third diamine and the CTE is shown in FIG. 6.

TABLE 4

| Acid dianhydride | | Diamine | | | CTE (averaged over 100° C. to 150° C.) | Glass transition temperature |
| --- | --- | --- | --- | --- | --- | --- |
| BPDA | PMDA | TFMB | HAB | APB | | |
| 50 | 50 | 80 | 20 | 0 | 8.359 ppm/° C. | Not measured |
| 50 | 50 | 75 | 20 | 5 | 10.89 ppm/° C. | Not measured |
| 50 | 50 | 70 | 20 | 10 | 13.00 ppm/° C. | 282.3° C. |
| 50 | 50 | 65 | 20 | 15 | 14.99 ppm/° C. | 278.7° C. |
| 50 | 50 | 60 | 20 | 20 | 20.71 ppm/° C. | 265.7° C. |
| 50 | 50 | 50 | 20 | 30 | 24.92 ppm/° C. | 238.0° C. |

CTE = coefficient of linear thermal expansion

The results indicate that the CTE of the polyimide can be adjusted to 8 to 33 ppm/° C. by varying the amount of APB. The results also indicate that the polyimide has a glass transition temperature of 300° C. or below, so that the effect on the conductor can be minimized even when the polyimide is heated above the glass transition temperature.

Example 6

Synthesis of Polyimide Compound
(BPDA:PMDA/TFMB:HAB:APB)
[50.5:50.5/65:20:15]

In view of the results of Examples 1 through 5, a polyimide compound was synthesized.

In a 500 ml four-necked separable flask, 2.54 g HAB (11.7 mmol), TFMB (38.2 mmol) and 2.57 g APB (8.79 mmol), each a diamine, were completely dissolved in 220 g of NMP under atmosphere of dry nitrogen.

Figure 7:
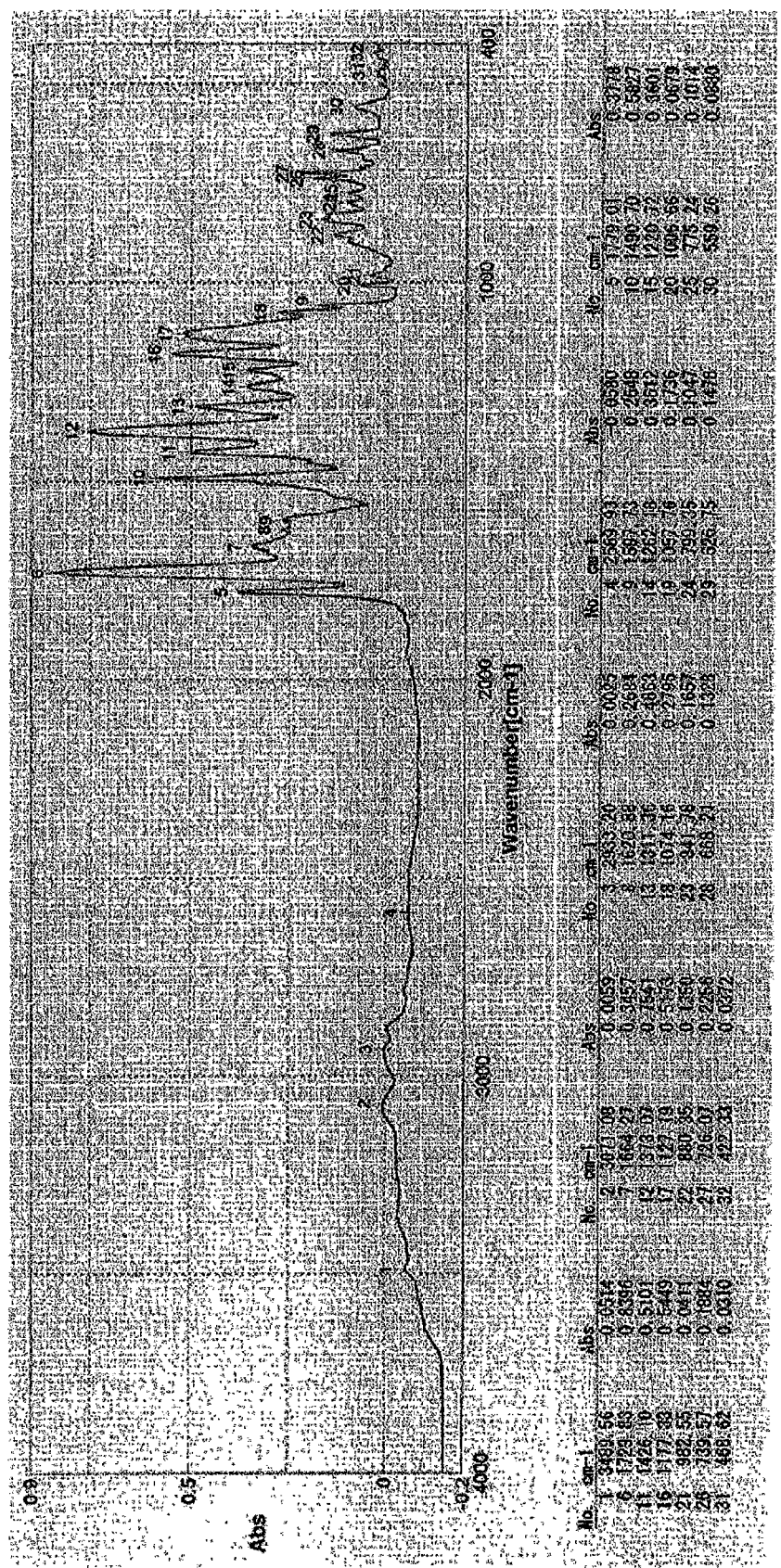
FIG. 7 is an IR absorption spectrum of a synthetic polyimide compound of the present invention.

To this solution, 8.71 g BPDA (29.6 mmol) and 6.46 g PMDA (29.6 mmol), each a powdered acid dianhydride, were added at once. The mixture was stirred at room temperature for 1 hour. Once the acid dianhydrides were completely dissolved, the mixture was stirred at 80° C. for 1 hour. 15 ml toluene was added as an azeotropic agent and the mixture was stirred at 195° C. for 90 minutes for imidization. During the imidization process, the water generated was constantly evaporated at 90° C., an azeotropic temperature of toluene/water, and removed from the system to allow the partial imidization to proceed. The imidization rate was adjusted by varying the temperature and reaction time to give a polyimide compound. When the mixture was stirred for more than 90 minutes while being heated, the imidization rate exceeded 90% and the polyimide compound gelated at room temperature. The specific viscosity of the resulting polyimide compound determined by an Ostwald viscometer was 0.6 dL/g (0.5 wt % NMP solution at 30.0° C.). The IR absorption spectrum of the polyimide is shown in FIG. 7. The imidization rate of the polyimide was 77%.

Example 7

Synthesis of Polyimide Compound
(BPDA:PMDA/TFMB:BIS-AP-AF)
[50.5:50.5/80:20]

Figure 8:
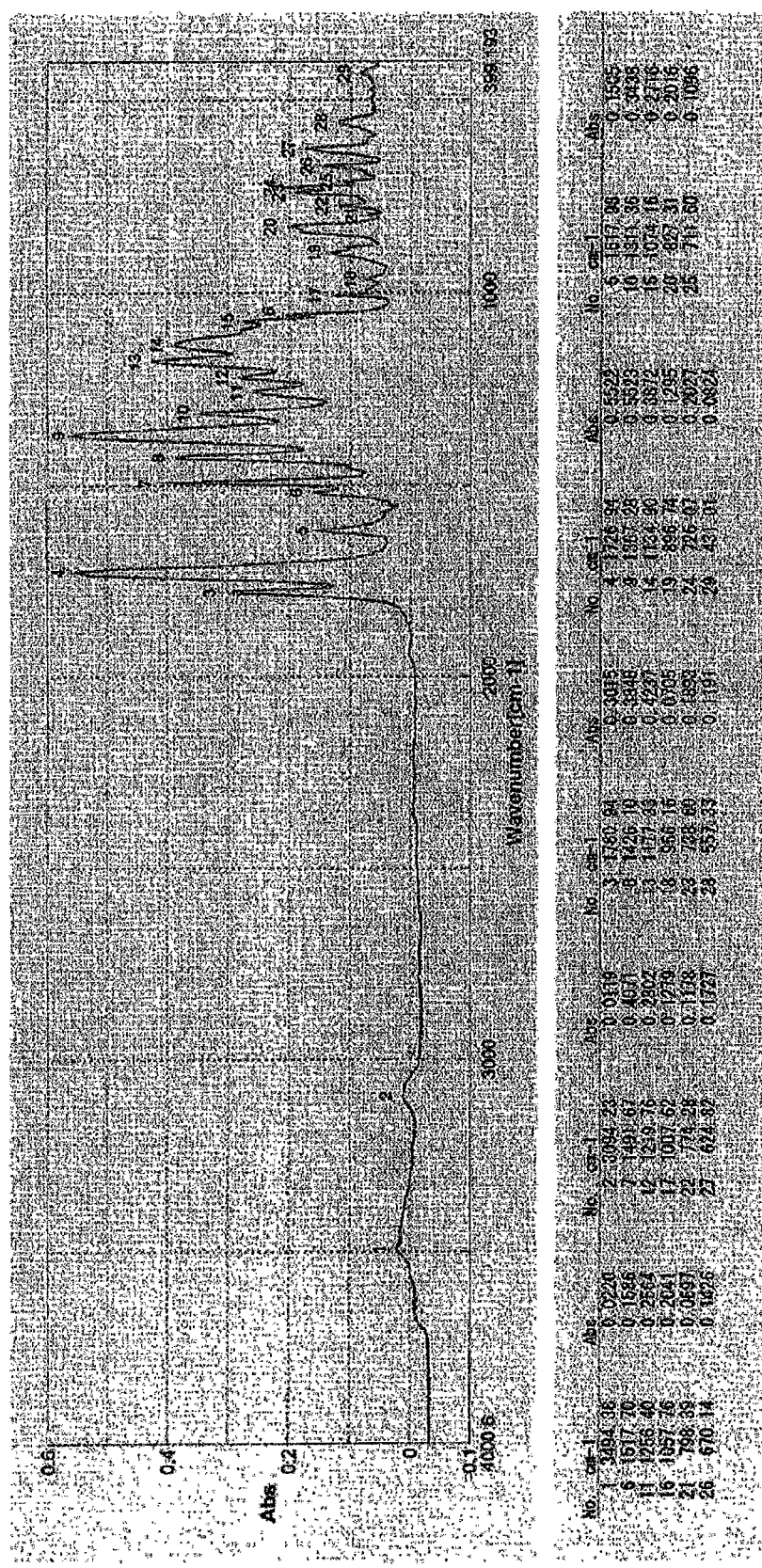
FIG. 8 is an IR absorption spectrum of another synthetic polyimide compound of the present invention.

In a 500 ml four-necked separable flask, BIS-AP-AF (3.73 g: 10.2 mmol) and TFMB (13.04 g: 40.7 mmol), each a diamine, were completely dissolved in 220 g of NMP under atmosphere of dry nitrogen. To this solution, BPDA (7.56 g: 25.7 mmol) and PMDA (5.61 g: 25.7 mmol), each a powdered acid dianhydride, were added at once. The mixture was stirred at room temperature for 1 hour. Once the acid dianhydrides were completely dissolved, the mixture was stirred at 80° C. for additional 1 hour. 15 ml toluene was then added as an azeotropic agent and the mixture was stirred at 185° C. for 300 minutes to allow the imidization to proceed in the mixture. During the imidization process, the water generated was constantly evaporated at 90° C., an azeotropic temperature of toluene/water, and removed from the system until the imidization was completed (100% imidization). The specific viscosity of the resulting polyimide compound determined by an Ostwald viscometer was 0.8 dL/g (0.5 wt % NMP solution at 30.0° C.). The IR absorption spectrum of the polyimide is shown in FIG. 8. The imidization rate of the polyimide was 100%.

Example 8

Effect of Additives

Additives may be added to the polyimide of the present invention to provide photosensitivity or improve the adhesion of the polyimide. The effect of such additives on the curling of the flexible wiring boards was examined. In a similar manner to Example 1, polyimide compounds were prepared using acid dianhydrides BPDA and PMDA and diamines TFMB, HAB and APB. The resulting polyimide compounds were applied to a copper film and converted to polyimides. The effect of additives on the curling of the resulting flexible wiring boards is shown in Table 5. 2,3,4-trihydroxybenzophenone o-naphthoquinonediazide-4-sulfonic acid ester (DNQ) was added as a photosensitizer. A naphthalene epoxy (HP 4032D) was added as an additive to improve adhesion. A triazole anti-corrosion agent (CDA 1) was added as an additive to protect the copper from corrosion. In Table 5, "h" indicates the average height of the corners of the curled copper foil above the level surface. "φ" indicates the diameter of the copper foil curled up into a pencil-like shape. "+" indicates that the flexible wiring board curled with the polyimide inside, whereas "−" indicates that the flexible wiring board curled with the copper foil inside.

TABLE 5

| Amounts of additives | | | Conditions for heat treatment | |
|---|---|---|---|---|
| DNQ | HP 4032D | CDA 1 | 200° C. (10 min.), 250° C. (10 min) | 200° C. (10 min), 250° C. (10 min), 280° C. (10 min) |
| 0 part by wt | 0 part by wt | 0 part by wt | −1.0 mm (h) | −2.0 mm (h) |
| 15 parts by wt | 0 part by wt | 0 part by wt | 0 mm | −0.25 mm (h) |
| 30 parts by wt | 0 part by wt | 0 part by wt | +2.5 mm (h) | −0.75 mm (h) |
| 15 parts by wt | 1 part by wt | 0 part by wt | 0 mm | 0 mm |
| 30 parts by wt | 1 part by wt | 0 part by wt | +2.25 mm (h) | +1 mm (h) |
| 15 parts by wt | 1 part by wt | 1 part by wt | +1.18 mm (h) | −0.25 mm (h) |
| 30 parts by wt | 1 part by wt | 1 part by wt | +2.25 mm (h) | +0.75 mm (h) |

Monomer composition BPDA:PMDA/TFMB:HAB:APB [50:50/65:20:15]

The polyimides having the compositions shown in the table above each have a coefficient of linear thermal expansion of about 15 ppm/° C., which is somewhat smaller than the coefficient of linear thermal expansion of the copper film, 22 ppm/° C. Accordingly, the curling of each flexible wiring board falls within the acceptable range and the effect of the additives can be neglected.

Example 9

Imidization Rate and Alkali Solubility of Polyimide

Following the procedures of Examples 1, 6 and 7, three types of polyimide compounds having respective imidization rates of 36%, 77% and 100% were prepared from acid dianhydrides BPDA and PMDA and diamines TFMB, HAB, BIS-AP-AF and APB. 30 parts by weight of DNQ with respect to the solid component of the polyimide compound were added to each polyimide compound as a photosensitizer. Using a bar coater, each polyimide compound was applied to a copper foil and was dried at 100° C. for 20 minutes to make a flexible wiring board. Each of the three flexible wiring boards was masked at the polyimide layer side with a film that transmits light in such a manner that the light transmittance gradually increases from one region of the film to another. Using an ultra high pressure mercury lamp that covers three wavelength ranges, the film was irradiated with light at an intensity of 40 mW/cm$^2$, or 3000 mJ/cm$^2$. By applying masking with this film, the amount of light energy reaching the polyimide layer can be gradually varied from one region of the film to another. Following exposure to light, each flexible wiring board was immersed in a 3 wt % aqueous sodium hydroxide solution at 40° C. for 2 to 3 minutes. The flexible wiring boards were then immersed in distilled water at room temperature for 2 minutes while the water was irradiated with ultrasound. Subsequently, the wiring boards were dried and the thickness of the polyimide layer on each board was measured. The results are shown in FIG. 9.

Figure 9:
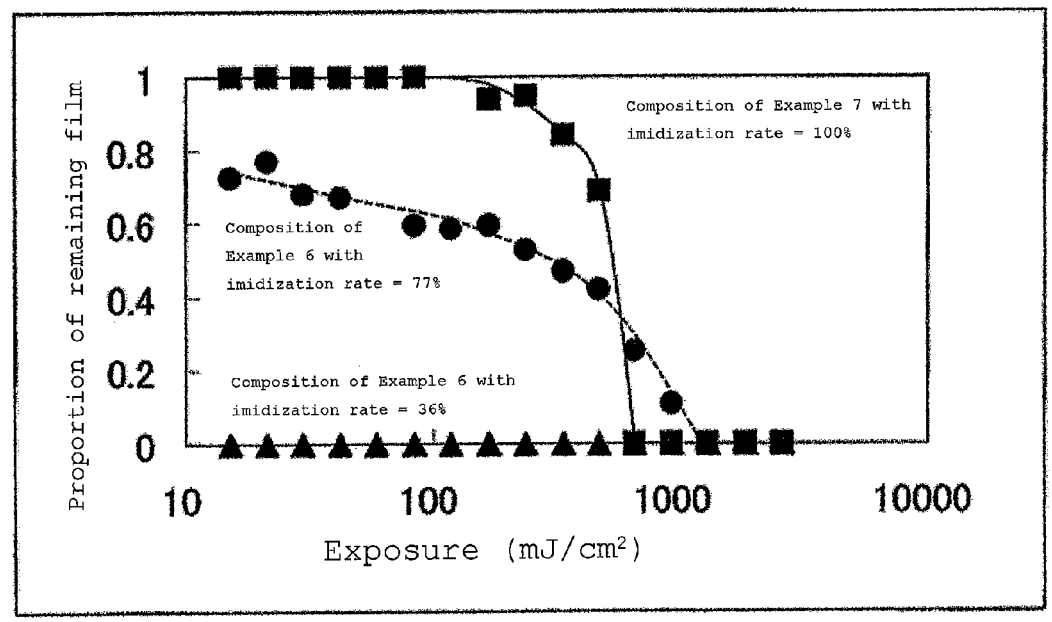
FIG. 9 is a diagram showing the relationship between the exposure and the proportion of remaining film for flexible wiring boards of the present invention with different imidization rates.
Figure 10:
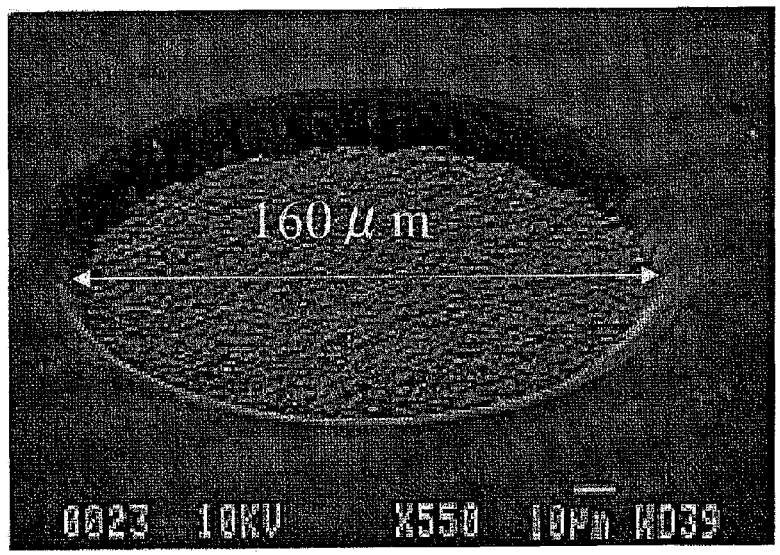
FIG. 10 shows a positive pattern formed on a flexible wiring board of the present invention.
Figure 11:
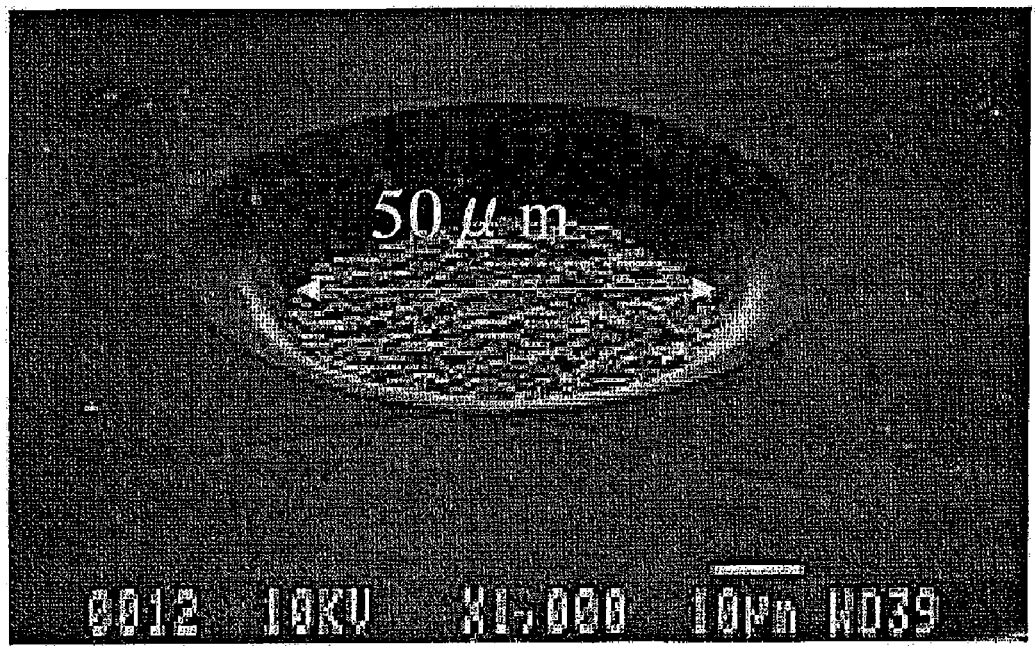
FIG. 11 shows another positive pattern formed on a flexible wiring board of the present invention.
Figure 12:
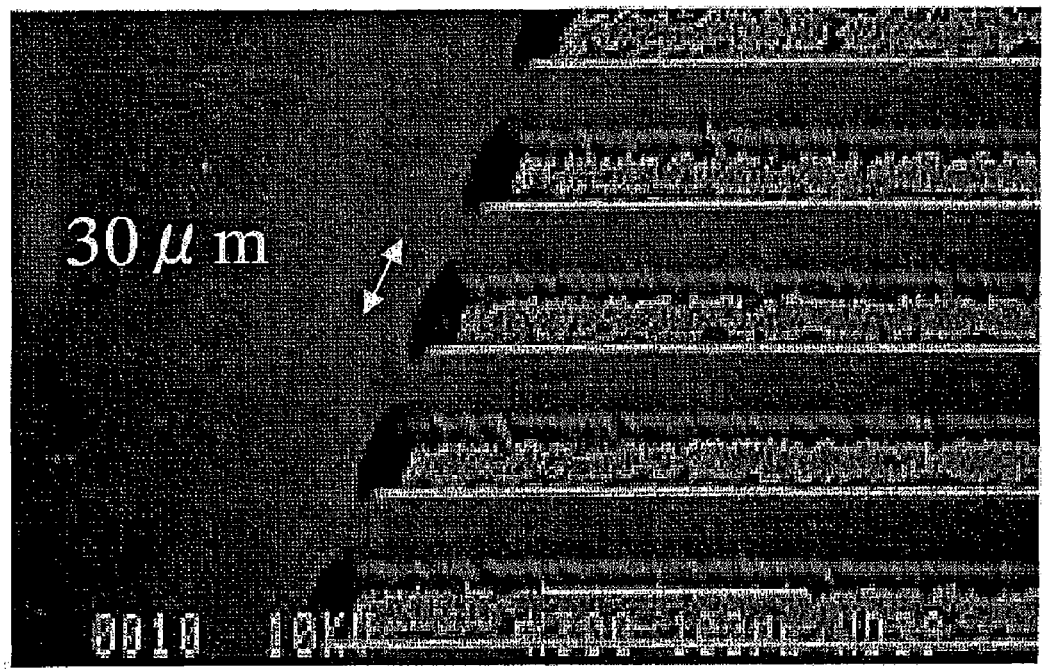
FIG. 12 shows still another positive pattern formed on a flexible wiring board of the present invention.
Figure 13:
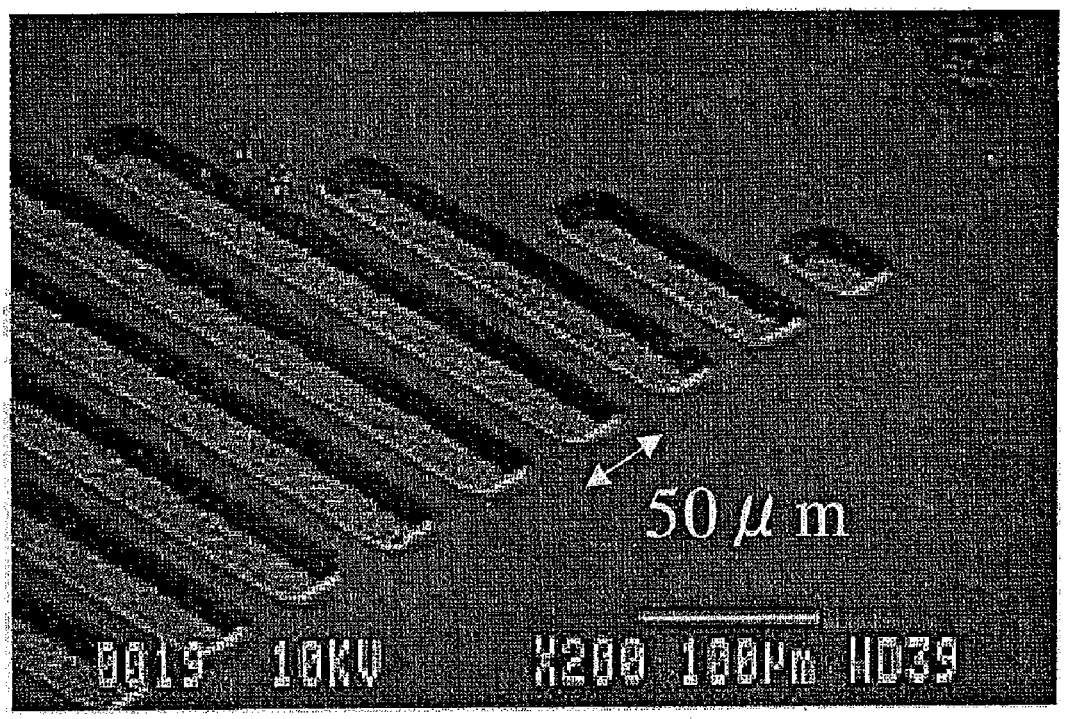
FIG. 13 shows still another positive pattern formed on a flexible wiring board of the present invention.

As shown in FIG. 9, the polyimide compound with imidization rate of 36% showed so high a solubility in the alkaline solution that the polyimide layer was entirely dissolved. In addition, the flexible wiring board made with this polyimide compound curled as the polyimide precursor was imidized and contracted during polyimide formation. The polyimide compound with imidization rate of 77% became soluble in the alkaline solution when irradiated at an intensity of 1340 mJ/cm$^2$ or higher. This compound remained insoluble in the alkaline solution when the intensity of irradiation was 1340 mJ/cm$^2$ or lower. The flexible wiring board made with this polyimide compound did not curl after polyimide formation. The polyimide compound with imidization rate of 100% became soluble in the alkaline solution when irradiated at an intensity of 670 mJ/cm$^2$ or higher. This compound remained insoluble in the alkaline solution when the intensity of irradiation was 670 mJ/cm$^2$ or lower. The flexible wiring board made with this polyimide compound did not curl after polyimide formation.

Example 10

Addition of Photosensitizer

An acid dianhydride comprising 50 mol % BPDA and 50 mol % PMDA was polymerized with a diamine comprising 65 mol % TFMB, 20 mol % HAB, and 15 mol % APB to form a polyimide compound. The imidization rate of the polyimide compound was adjusted to 80%. This polyimide compound was then dissolved in NMP and 30 parts by weight of DNQ were added as a photosensitizer. The mixture was stirred. The resulting solution was applied to a copper foil and was dried at 100° C. for 10 minutes to deposit a 10 μm thick layer of the polyimide compound on the copper foil. This board was exposed to light at an intensity of 10 mW/cm$^2$, or 3000 mJ/cm$^2$. The exposed board was then alkali-developed by immersing in a 10 wt % aqueous potassium hydroxide solution at 20° C. to 25° C. for 75 seconds. The developed board was pulled out of the solution, was washed with water at 20° C. to 25° C. for 1 to 2 minutes, and was dried. The SEM images of the developed pattern are shown in FIGS. 10, 11, 12 and 13.

These results suggest that the presence of the photosensitizer causes the solubility of the polyimide compound in an alkali solution in the exposed area to change from the solubility in the unexposed area so that the compound is selectively removed in the exposed area. Thus, the addition of the photosensitizer to the polyimide compound of the present invention enables positive patterning on the polyimide compound, forming a desired shape on the flexible wiring board.

The invention claimed is:

1. A polyimide compound obtained by the reaction of an acid dianhydride with a diamine and represented by the following formula (1):

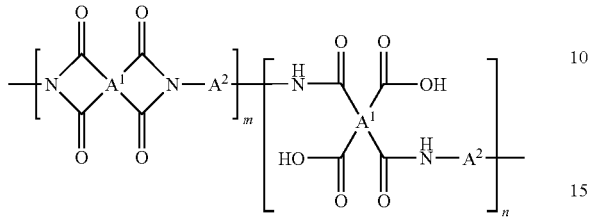

(1)

wherein $A^1$ is an organic group containing an aromatic ring or an alicyclic group; $A^2$ is an organic group containing an aromatic ring; and m and n are each an integer, the diamine comprising a first diamine that is 2,2'-bistrifluoromethyl-4,4',-diaminobiphenyl, and a second diamine that is 4,4'-diamino-3,3'-biphenyldiol;

wherein the first diamine accounts for 45 mol % or more of the diamine, and the second diamine accounts for 20 mol % or more of the diamine; and wherein the imidization rate is adjusted to 70% to 100%.

2. The polyimide compound according to claim 1, which is soluble in a solvent.

3. The polyimide compound according to claim 1, which contains a photosensitizer.

4. The polyimide compound according to claim 3, wherein the photosensitizer is an o-quinonediazide compound.

5. A flexible wiring board comprising:
a conductor; and
a polyimide layer formed of a polyimide compound obtained by the reaction of an acid dianhydride with a diamine and represented by the following formula (1):

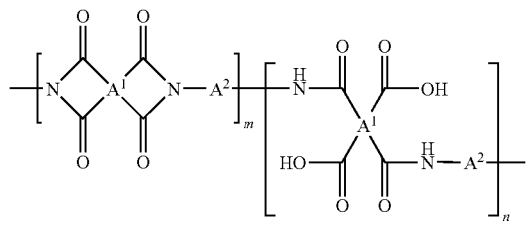

(1)

wherein $A^1$ is an organic group containing an aromatic ring or an alicyclic group; $A^2$ is an organic group containing an aromatic ring; and m and n are each an integer, the diamine comprising a first diamine that is 2,2'-bistrifluoromethyl-4,4',-diaminobiphenyl, and a second diamine that is that is 4,4'-diamino-3,3'-biphenyldiol, wherein the first diamine accounts for 45 mol % or more of the diamine, and the second diamine accounts for 20 mol % or more of the diamine; and wherein an imidization rate of the polyimide compound is adjusted to 70% to 100%.

* * * * *